(12) United States Patent
He

(10) Patent No.: US 8,456,457 B2
(45) Date of Patent: Jun. 4, 2013

(54) PRINTED CIRCUIT BOARD

(75) Inventor: Feng-Long He, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 337 days.

(21) Appl. No.: 13/037,476

(22) Filed: Mar. 1, 2011

(65) Prior Publication Data

US 2012/0105386 A1 May 3, 2012

(30) Foreign Application Priority Data

Oct. 27, 2010 (CA) .......................... 2010 2 0578972

(51) Int. Cl.
*G09G 5/00* (2006.01)
(52) U.S. Cl.
USPC .......................................... 345/204; 349/150
(58) Field of Classification Search
USPC ..... 345/87, 204; 349/149, 150, 151; 361/152; 439/329; 327/67; 174/254, 268
See application file for complete search history.

(56) References Cited

U.S. PATENT DOCUMENTS 7,965,367 B2 * 6/2011 Oohira .......................... 349/150

* cited by examiner

*Primary Examiner* — Abbas Abdulselam
(74) *Attorney, Agent, or Firm* — Altis Law Group, Inc.

(57) ABSTRACT

A printed circuit board electrically connected to a display includes a plurality of display control units, a plurality of first forward different signal lines, at least one second forward differential signal line, and a plurality of zero-ohm resistors. The display control units provide differential signals for the display through the differential signal lines and the zero-ohm resistors. Any two of the first forward differential signal lines are electrically connected together at one end to form a first node. One end of the second forward differential signal line is electrically connected to the first node. The other end is electrically connected to another first forward differential signal line to form a second node. The zero-ohm resistors are placed on the first forward differential signal lines and the second forward differential signal lines and are electrically connected between the display control units and the display.

15 Claims, 1 Drawing Sheet

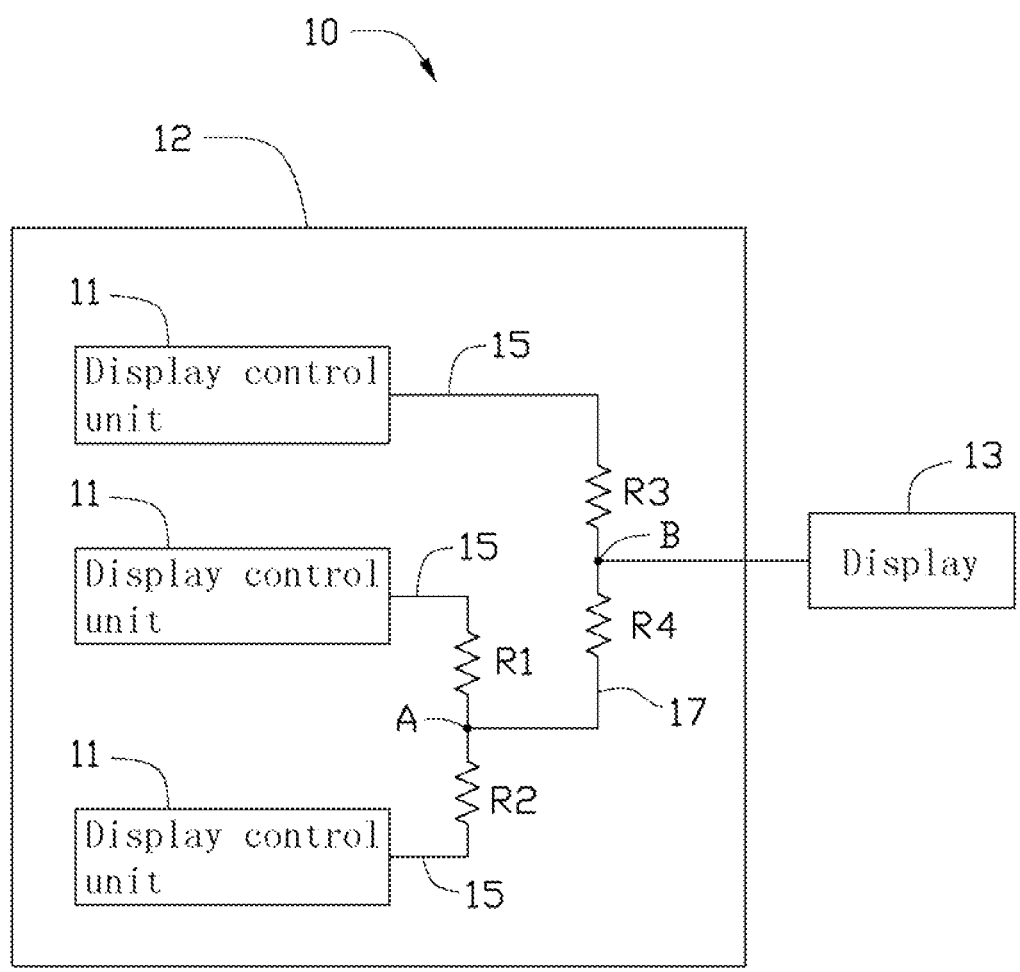

PRINTED CIRCUIT BOARD

BACKGROUND

1. Technical Field

The disclosure generally relates to a printed circuit board (PCB).

2. Description of the Related Art

Low voltage differential signaling (LVDS) is an electrical signaling system that can run at very high speeds over twisted-pair copper cables. For example, a liquid crystal display (LCD) is electrically connected to different display control devices, such as graphic processing unit (GPU), platform controller hub (PCH) and scaler, to receive the differential signals from the display control devices, forming various transmission paths.

However, in the actual PCB layout, the differential signals may interfere with each other. Also, due to space limitations on the PCB, the differential signals are further easily interfered by electromagnetic interference. Thus, radiation noise may be easily produced, which may reduce signal transmission quality. In addition, to avoid radiation noise, a PCB layout may be complicated and difficult to design.

Therefore, there is room for improvement within the art.

BRIEF DESCRIPTION OF THE DRAWINGS

Many aspects of an exemplary printed circuit board can be better understood with reference to the following drawing. The components in the drawing are not necessarily drawn to scale, the emphasis instead being placed upon clearly illustrating the principles of the exemplary printed circuit board. Moreover, in the drawing, like reference numerals designate corresponding parts throughout the several views. Wherever possible, the same reference numbers are used throughout the drawings to refer to the same or like elements of an embodiment.

The drawing is a circuit view of differential signal lines of a printed circuit board, according to an exemplary embodiment.

DETAILED DESCRIPTION

The drawing shows an exemplary embodiment of a printed circuit board (PCB) 10, which is electrically connected to a display 13. The PCB 10 includes at least one signal layer 12, a plurality of display control units 11, a plurality of zero-ohm resistors, and a plurality of groups of differential signal lines. The zero-ohm resistors and the differential signal lines are laid out and placed on the signal layer 12.

In this exemplary embodiment, the display control units 11 may be a graphic processing unit (GPU), a platform controller hub (PCH), or a scaler, which are electrically connected to the display 13 through the zero-ohm resistors and the differential signal lines. Each group of differential signal lines includes a forward differential signal line and a reverse differential signal line coupled with a corresponding forward different signal line to enhance signal interaction and signal coupling. The forward differential signal lines are used here as an example to illustrate the circuit connection of the PCB 10.

The number of the forward differential signal lines depends on the number of display control units 11. In this exemplary embodiment, where there are three display control units 11, the forward differential signal lines include three first forward differential signal lines 15 and a second forward differential signal line 17. One end of each first forward differential signal line 15 is electrically connected to a corresponding display control unit 11 via a pad (not shown), and the other ends of the two forward differential signal lines 15 are electrically connected to each other to form a first node A. One end of the second forward differential signal line 17 is electrically connected to the first node A, and the other end of the second forward differential signal line 17 is electrically connected to the other end of the first forward differential signal line 15 to form a second node B. The second node B is electrically connected to the display 13.

In this exemplary embodiment, the zero-ohm resistors includes a first zero-ohm resistor R1, a second zero-ohm resistor R2, a third zero-ohm resistor R3, and a fourth zero-ohm resistor R4. In detail, the first zero-ohm resistor R1 is placed on one of the first forward differential signal line 15 between the first node A and one of the display control units 11; the second zero-ohm resistor R2 is placed on the other first forward differential signal line 15 between the first node A and the other display control unit 11. The third zero-ohm resistor R3 is placed on the other first forward differential signal line 15 between the second node B and the display control unit 11; the fourth zero-ohm resistor R4 is placed on the second forward differential signal line 17 between the first node A and the second node B. The zero-ohm resistors R1, R2, R3 and R4 are detachably positioned on the signal layer 12 of the PCB 10 by welding, bonding, soldering, or conductive glue. Thus, the zero-ohm resistors and the corresponding forward differential signal lines are connected in series to form differential signal transmission paths.

Further referring to the drawing, in use, the zero-ohm resistors R1, R2, R3, and R4 are placed on the first forward differential signal lines 15 and the second forward differential signal line 17, the first node A is located between the zero-ohm resistors R1 and R2, and the second node B is located between the zero-ohm resistors R3 and R2, therefore forming various differential signal transmission paths. Moreover, the zero-ohm resistors are placed on the signal layer 12, which can reduce radiation noise and improve signal transmission quality on the transmission paths. For example, when the differential signals from one of the display control units are transmitted to the display 13 through the first forward differential signal line 15 and the zero-ohm resistor R3, the differential signals cannot interfere and radiate via the second forward differential line 17 and the zero-ohm resistor R4.

In summary, in the PCB 10 of this exemplary embodiment, the zero-ohm resistors are placed on the differential signal lines, and are electrically connected by the first node A and the second node B to form various differential signal transmission paths to transmit differential signals. In addition, the zero-ohm resistors are placed on the limited layout space of the PCB 10, therefore, the differential signal from the display control units 11 are transmitted along the differential transmission paths to the display 13 without radiation noise and mutual interference, which will prevent the electromagnetic interference to increase transmission sensitivity and a communication quality.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in matters of shape, size, and arrangement of parts within the principles of exemplary disclosure to the full extent indicated by the broad general meaning of the terms in which the appended claims are expressed.

What is claimed is:

1. A printed circuit board electrically connected to a display, comprising:

a plurality of display control units, each display unit providing differential signals for the display;
a plurality of first forward differential signal lines electrically connected between the display control units and the display;
at least one second forward differential signal line; and
a plurality of zero-ohm resistors, wherein any two of the first forward differential signal lines are electrically connected together at one end to form a first node, one end of the second forward differential signal line is electrically connected to the first node, the other end is electrically connected to another first forward differential signal line to form a second node, and the zero-ohm resistors are placed on the first forward differential signal lines and the second forward differential signal lines and are electrically connected between the display control units and the display.

2. The printed circuit board as claimed in claim 1, further comprising at least one signal layer, wherein the display control units, the first forward differential signal lines, the second forward differential signal line, and the zero-ohm resistors are electrically placed on the signal layer.

3. The printed circuit board as claimed in claim 2, further comprising a plurality of reverse differential signal lines coupled with the forward differential signal lines to enhance signal interaction and signal coupling.

4. The printed circuit board as claimed in claim 1, wherein the display control units are graphic processing units, platform controller hubs, and scaler.

5. The printed circuit board as claimed in claim 1, wherein a first zero-ohm resistor is placed on one of the first forward differential signal line between the first node and one of the display control units, a second zero-ohm resistor is placed on the other first forward differential signal line between the first node and the other display control unit, a third zero-ohm resistor is placed on the other first forward differential signal line between the second node and the display control unit, and a fourth zero-ohm resistor is placed on the second forward differential signal line between the first node and the second node.

6. The printed circuit board as claimed in claim 1, wherein the zero-ohm resistors and their corresponding forward differential signal lines are connected in series to form corresponding differential signal transmission paths to transmit differential signals from the display control units to the display.

7. The printed circuit board as claimed in claim 6, wherein the zero-ohm resistors and their corresponding differential signal transmission paths are capable of reducing radiation noise and improving transmission quality.

8. The printed circuit board as claimed in claim 1, wherein the number of the zero-ohm resistors is four, the number of the first forward differential signal lines is three, the number of the second forward differential signal lines is one, and the number of the display control units is three.

9. A printed circuit board electrically connected to a display, comprising:
three display control units that provide and output differential signals for the display;
three first forward differential signal lines electrically connected between the display control units and the display;
a second forward differential signal line; and
four zero-ohm resistors, wherein two of the first forward differential signal lines are electrically connected to each other at one end to form a first node, one end of the second forward differential signal line is electrically connected to the first node, the other end of the second forward differential signal line is electrically connected to another first forward differential signal line to form a second node, and the zero-ohm resistors are placed on the first forward differential signal lines and the second forward differential signal lines and are electrically connected through the first node and the second node to form differential signal transmission paths to transmit differential signals.

10. The printed circuit board as claimed in claim 9, further comprising at least one signal layer, wherein the display control units, the first forward differential signal lines, the second forward differential signal line, and the zero-ohm resistors are electrically placed on the signal layer.

11. The printed circuit board as claimed in claim 9, wherein the display control units are graphic processing units, platform controller hubs, and scaler.

12. The printed circuit board as claimed in claim 9, wherein a zero-ohm resistor is placed on one of the first forward differential signal line between the first node and one of the display control units, a second zero-ohm resistor is placed on the other first forward differential signal line between the first node and the other display control unit, a third zero-ohm resistor is placed on the other first forward differential signal line between the second node and the display control unit, and a fourth zero-ohm resistor is placed on the second forward differential signal line between the first node and the second node.

13. The printed circuit board as claimed in claim 9, wherein the zero-ohm resistors and their corresponding differential signal transmission paths are capable of reducing radiation noise and improving transmission quality.

14. The printed circuit board as claimed in claim 9, wherein the number of the zero-ohm resistors is four, the number of the first forward differential signal lines is three, the number of the second forward differential signal lines is one, and the number of the display control units is three.

15. The printed circuit board as claimed in claim 10, further comprising a plurality of reverse differential signal lines coupled with the forward differential signal lines to enhance signal interaction and signal coupling.

* * * * *